(12) United States Patent
Pfannenmüller et al.

(10) Patent No.: US 12,308,815 B2
(45) Date of Patent: May 20, 2025

(54) DIFFERENTIAL DOUBLE BALANCED DUPLEXER

(71) Applicant: Apple Inc., Cupertino, CA (US)

(72) Inventors: Christof Pfannenmüller, Erlangen (DE); Joonhoi Hur, Sunnyvale, CA (US); Dominic Koehler, Viereth-Trunstadt (DE); Harald Pretl, Schwertberg (AT); Rastislav Vazny, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 184 days.

(21) Appl. No.: 17/945,826

(22) Filed: Sep. 15, 2022

(65) Prior Publication Data

US 2024/0097639 A1 Mar. 21, 2024

(51) Int. Cl.
*H01Q 5/30* (2015.01)
*H03H 7/42* (2006.01)
*H03H 7/46* (2006.01)
*H04B 1/00* (2006.01)

(52) U.S. Cl.
CPC ............ *H03H 7/425* (2013.01); *H03H 7/463* (2013.01)

(58) Field of Classification Search
CPC ............ H01Q 1/38; H01Q 5/30; H01Q 5/307; H03H 2210/025; H03H 7/09; H03H 7/425; H03H 7/463; H04B 1/525; H04B 1/00; H04B 1/12; H04B 1/18; H04B 1/38
See application file for complete search history.

(56) References Cited

U.S. PATENT DOCUMENTS

| 4,160,210 | A | * | 7/1979 | Molinari | H05K 1/026 |
| | | | | | 333/33 |
| 5,030,963 | A | * | 7/1991 | Tadama | H01Q 1/48 |
| | | | | | 343/702 |
| 5,990,838 | A | * | 11/1999 | Burns | H01Q 21/29 |
| | | | | | 343/702 |
| 7,170,465 | B2 | * | 1/2007 | Rofougaran | H04B 1/18 |
| | | | | | 343/749 |
| 8,138,853 | B2 | | 3/2012 | Chu | |
| 10,535,925 | B2 | * | 1/2020 | Kerselaers | H01Q 1/44 |
| 11,265,038 | B1 | * | 3/2022 | Muharemovic | H03F 1/565 |
| 2022/0038122 | A1 | | 2/2022 | Hur et al. | |
| 2022/0182079 | A1 | | 6/2022 | Muharemovic et al. | |

* cited by examiner

*Primary Examiner* — Tho G Phan
(74) *Attorney, Agent, or Firm* — FLETCHER YODER PC

(57) ABSTRACT

A differential double balanced duplexer (dDBD) includes a transmitter and a first balun are coupled to a first impedance tuner that produces a first impedance that blocks received signals at a first frequency range from travelling across the first balun and into the transmitter, and a second impedance that passes transmitted signals at a second frequency range to travel across the first balun to the antenna. The dDBD also includes a receiver and a second balun coupled to a second impedance tuner that produces a first impedance that allows the received signals at the first frequency range to travel across the second balun and into the receiver, and a second impedance that blocks the transmitted signals at the second frequency range from travelling across the second balun and into the receiver. As such, the dDBD allows for increased isolation and decreased insertion loss.

20 Claims, 8 Drawing Sheets

DIFFERENTIAL DOUBLE BALANCED DUPLEXER

BACKGROUND

The present disclosure relates generally to wireless communication, and more specifically to isolation of wireless signals between transmitters and receivers in wireless communication devices.

In an electronic device, a transmitter and a receiver may each be coupled to one or more antennas to enable the electronic device to both transmit and receive wireless signals. The electronic device may include a duplexer that isolates the transmitter from received signals of a first frequency range, and isolates the receiver from transmission signals of a second frequency range (e.g., thus implementing frequency division duplex (FDD) operations). In this manner, interference between the transmission and received signals may be reduced when communicating using the electronic device. However, these communications may be negatively impacted by insertion loss resulting from components of the duplexer providing less than ideal isolation of the transmission and/or received signals.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a communication device includes one or more antennas, communication circuitry, and isolation circuitry coupling the one or more antennas to the communication circuitry. The isolation circuitry includes a first balun with a first portion and a second portion, and a first impedance tuner coupled to the communication circuitry via a first node and to the second portion of the first balun via the first node and a second node. Additionally, the first portion of the first balun is coupled to the one or more antennas.

In another embodiment, a communication device includes one or more antennas configured to receive one or more receive signals that are within a first frequency range. Furthermore, the one or more antennas are configured to transmit one or more transmission signals that are within a second frequency range. The communication device also includes receiver circuitry configured to receive the one or more receive signals via the one or more antennas, and transmitter circuitry configured to transmit the one or more transmission signals via the one or more antennas. In addition, the communication device includes a first balun coupled to the one or more antennas and a first variable impedance tuner. The first balun, the first variable impedance tuner, and the receiver circuitry coupled together via a first node. The communication device also includes a second balun coupled to the one or more antennas and a second variable impedance tuner. The second balun, the second impedance tuner, and the transmitter circuitry coupled together via a second node.

In yet another embodiment, a radio frequency transceiver includes one or more antennas configured to receive a first signal at a first frequency and configured to transmit a second signal at a second frequency. The radio frequency transceiver also includes a first balun coupled to the one or more antennas, a second balun coupled to the one or more antennas, transmitter circuitry coupled to the first balun, and receiver circuitry coupled to the second balun. In addition, the transmitter circuitry is configured to transmit the second signal and the receiver circuitry is configured to receive the first signal. Furthermore, the radio frequency transceiver includes a first impedance tuner coupled to the transmitter circuitry and the first balun via a first node, and a second impedance tuner coupled to the receiver circuitry and the second balun via a second node. The first impedance tuner having a first impedance at the first frequency and a second impedance at the second frequency, and the second impedance tuner have a third impedance at the first frequency and a fourth impedance at the second frequency.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
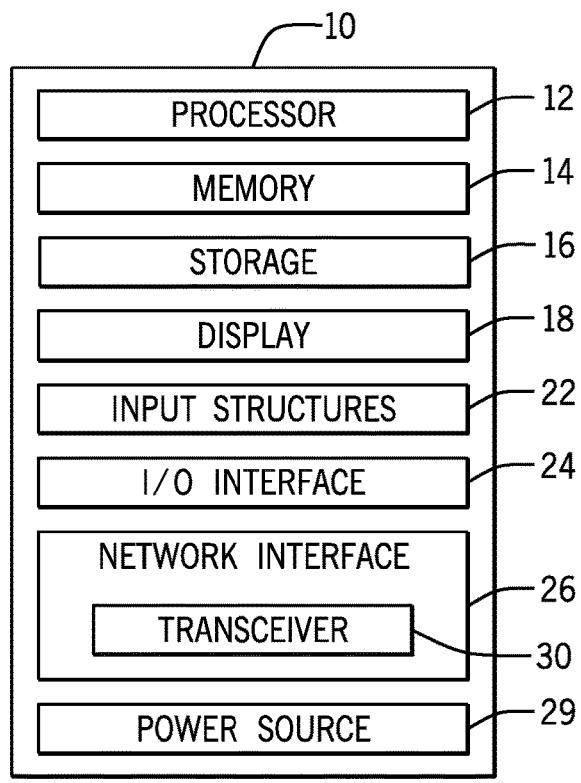
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members. Furthermore, the term "coupled" should be understood to mean connected directly to or connected through one or more intervening components or circuits.

This disclosure is directed to isolating wireless signals between a transmitter and a receiver in a wireless communication device using isolation circuitry that includes a duplexer (e.g., an electrical balanced duplexer (EBD), a phase balanced duplexer (PBD), Wheatstone balanced duplexer (WBD), a differential double balanced duplexer (dDBD), a circular balanced duplexer (CBD), or any other duplexer used to isolate wireless signals between transmitters and receivers). However, in some isolation circuitry, isolation performance may be relatively low (e.g., such that transmission signals transmitted by the transmitter may interfere with receive signal received at a receiver, or vice versa) and/or insertion loss (e.g., loss resulting from transmission signals leaking to the receiver or receive signals leaking to the transmitter) may be relatively high. Additionally, in some isolation circuitry, sufficient isolation may be limited to a substantially narrow (e.g., small, limited) range of frequencies of the wireless signals. Moreover, some isolation circuitry may include additional elements in an attempt to produce effective isolation (e.g., blockers for handling high input power). However, the inclusion of the additional elements to the isolation circuitry may increase a footprint (e.g., size, dimensions) of the isolation circuitry within the wireless communication device.

Embodiments herein provide various apparatuses and techniques to reduce insertion loss and/or enhance isolation of the wireless signals of the wireless communication device over an improved range of frequencies. To do so, the embodiments disclosed herein include isolation circuitry that includes two or more baluns coupled to the transmitter and/or receiver and additionally to an impedance tuner or gradient. This arrangement may be referred to as a differential double balanced duplexer. In particular, embodiments disclosed herein may have a first balun (e.g., transmitter balun) that substantially prevents, reduces, or mitigates a leakage signal (e.g., a receive signal) received at an antenna to reach the transmitter. The first balun may be coupled between the transmitter and the antenna (e.g., that isolates the transmitter from received signals received by the antenna, and enables transmission signals sent from the transmitter to pass through to the antenna). The transmitter and the first balun may also be coupled to a first impedance tuner (e.g., a transmitter impedance tuner). The first impedance tuner may produce a first impedance (e.g., high impedance) that blocks the received signals at a first frequency range from travelling across the first balun and into the transmitter, and a second impedance (e.g., low impedance) that passes (e.g., allows) the transmitted signals at a second frequency range to travel across the first balun to the antenna. The isolation circuitry may also have a second balun (e.g., receiver balun) that substantially prevents, reduces, or mitigates a leakage signal (e.g., a transmission signal) transmitted by the transmitter to reach a receiver. The second balun may be coupled between the receiver and the antenna (e.g., that isolates the receiver from transmission signals sent from the transmitter to pass through to the antenna). The receiver and the second balun may also be coupled to a second impedance tuner (e.g., receiver impedance tuner). The second impedance tuner may produce a first impedance (e.g., low impedance) that allows the received signals at a first frequency range to travel across the second balun and into the receiver, and a second impedance (e.g., high impedance) that blocks the transmitted signals at a second frequency range from travelling across the second balun and into the receiver. As such, the first and second balun along with the transmitter and the receiver, both coupled to the first and second impedance tuner, respectfully, allow for effective (e.g., increased) isolation between the transmitter and receiver and decreased insertion loss between the transmitter and the antenna, and the antenna and the receiver.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30 (e.g., communication component, communication circuitry). In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
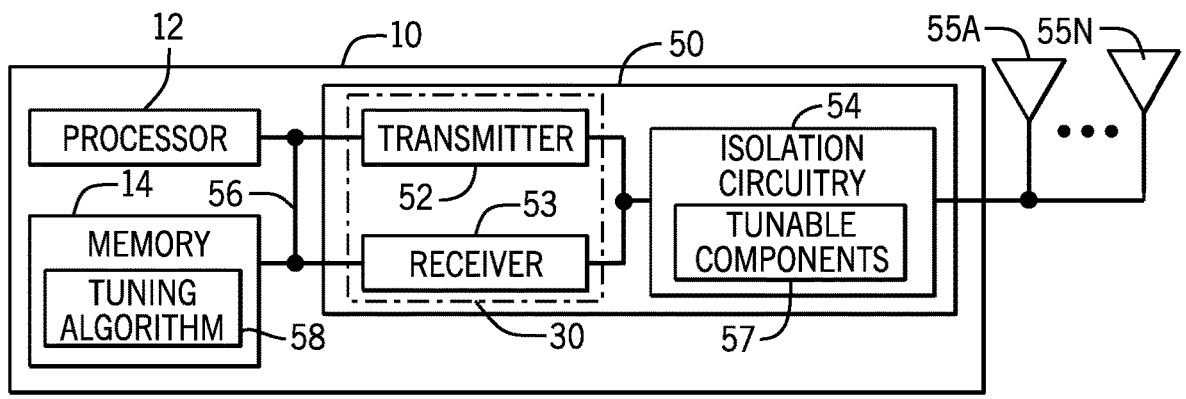
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, a radio frequency front end (RFFE) 50 having the transceiver 30, which may include one or more communication components (e.g., communication circuitry), and isolation circuitry 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another. The communication components may include a transmitter 52 and/or a receiver 53 that may enable communication via transmission and reception of signals.

In particular, the transmitter 52 and/or the receiver 53 may respectively enable transmission and reception of signals between the electronic device 10 and an external device via, for example, a network (e.g., including base stations or access points) or a direct connection. As illustrated, the transmitter 52 and the receiver 53 may be combined into the transceiver 30. The electronic device 10 may also have one or more antennas 55A-55N electrically coupled to the transceiver 30 via the isolation circuitry 54. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 53 may transmit and receive information via other wired or wireline systems or means.

The RFFE, 50 may include components of the electronic device 10 that receive as input, output, and/or process signals having radio frequency, including at least some components (e.g., the power amplifier 66, the filter 68) of the transmitter 52, at least some components (e.g., the low noise amplifier 82, the filter 84) of receiver 53, and the isolation circuitry 54. As illustrated, the isolation circuitry 54 is communicatively coupled between the transmitter 52 and the receiver 53, as well as the one or more antennas 55. The isolation circuitry 54 enables signals (e.g., received signals) of a first frequency range received via the one or more antennas 55 to pass through to the receiver 53 and blocks the received signals of the first frequency range from passing through to the transmitter 52. The isolation circuitry 54 also enables signals (e.g., transmission signals) of a second frequency range from the transmitter 52 to pass through to the one or more antennas 55 and blocks the signals of the second frequency range from passing through to the receiver 53. Each frequency range may be of any suitable bandwidth, such as between 0 and 100 gigahertz (GHz) (e.g., 10 megahertz (MHz)), and include any suitable frequencies. For example, the first frequency range (e.g., a transmit frequency range) may be between 880 and 890 MHz, and the second frequency range (e.g., a receive frequency range) may be between 925 and 936 MHz.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

The isolation circuitry 54 may include one or more tunable components 57 that may be adjusted or tuned (e.g., resistive devices such as resistors, inductive devices such as inductors, capacitive devices such as capacitors, and so on) to alter isolation performance and insertion loss (e.g., loss resulting from non-ideal behavior of components of the isolation circuitry 54 between the transmitter 52, the receiver 53, and/or the antenna 55). In particular, the processor 12 may adjust or tune the one or more tunable components 57 based on tuning states and/or a tuning algorithm 58 stored in the memory 14 and/or the storage 16. In some embodiments, the tuning algorithm 58 may include tuning states of the one or more tunable components 57 stored in a data structure saved in the memory 14 (e.g., lookup table) that enable a target isolation range and target insertion loss range associated with the transmitter 52, the receiver 53, and/or the antenna 55. In additional or alternative embodiments, the tuning algorithm 58 may include one or more algorithms that, when performed, enable the processor 12 to adjust or tune the one or more tunable components 57 to achieve the target isolation range and target insertion loss range associated with the transmitter 52, the receiver 53, and/or the antenna 55. The tuning algorithm may include machine-learning processes, optimization algorithms (e.g., nonlinear optimization algorithms, nonconvex optimization algorithms, deterministic global optimization solver algorithms, and so on), or the like.

Figure 3:
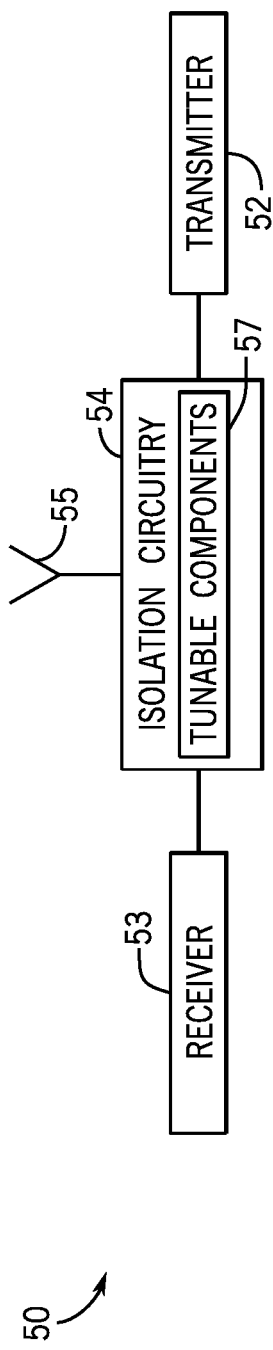
FIG. 3 is a schematic diagram of a radio frequency front end (RFFE) of the electronic device of FIG. 1 having isolation circuitry that isolates a transmitter of FIG. 2 from received signals of a first frequency range, and isolates a receiver of FIG. 2 from transmission signals of a second frequency range, according to embodiments of the present disclosure.

FIG. 3 is a schematic diagram of the RFFE, 50 of the electronic device 10, according to embodiments of the present disclosure. As described above, the RFFE 50 includes the isolation circuitry 54 that isolates the transmitter 52 from received signals of the first frequency range, and isolates the receiver 53 from transmission signals of the second frequency range, according to embodiments of the present disclosure. The RFFE 50 may include components of the electronic device 10 that receive as input, output, and/or process signals having radio frequency, including at least some components (e.g., the power amplifier 66, the filter 68) of the transmitter 52, at least some components (e.g., the low noise amplifier 82, the filter 84) of receiver 53, and the isolation circuitry 54. As illustrated, the isolation circuitry 54 is communicatively coupled between the transmitter 52 and the receiver 53, as well as the one or more antennas 55. The isolation circuitry 54 enables signals (e.g., received signals) of a first frequency range received via the one or more antennas 55 to pass through to the receiver 53 and blocks the received signals of the first frequency range from passing through to the transmitter 52. The isolation circuitry 54 also enables signals (e.g., transmission signals) of a second frequency range from the transmitter 52 to pass through to the one or more antennas 55 and blocks the signals of the second frequency range from passing through to the receiver 53. Each frequency range may be of any suitable bandwidth, such as between 0 and 100 gigahertz (GHz) (e.g., 10 megahertz (MHz)), and include any suitable frequencies. For example, the first frequency range (e.g., a transmit frequency range) may be between 880 and 890 MHz, and the second frequency range (e.g., a receive frequency range) may be between 925 and 936 MHz.

Due to a non-ideal nature of components of the isolation circuitry 54, when isolating the receiver 53 from a transmission signal generated by the transmitter 52, some of the transmission signal (e.g., a transmit leakage signal) may propagate toward the receiver 53. If a frequency of the transmit leakage signal is within the receive frequency range (e.g., is a frequency supported by the receiver 53), the transmit leakage signal may interfere with a receive signal and/or the receiver 53. Similarly, when isolating the transmitter 52 from a received signal received via the one or more antennas 55, some of the received signal (e.g., a receive leakage signal) may propagate toward the transmitter 52. If a frequency of the receive leakage signal is within the transmit frequency range (e.g., is a frequency supported by the transmitter 52), the receive leakage signal may interfere with the transmit signal and/or the transmitter 52. These leakage signals may be referred to as insertion loss.

Figure 4:
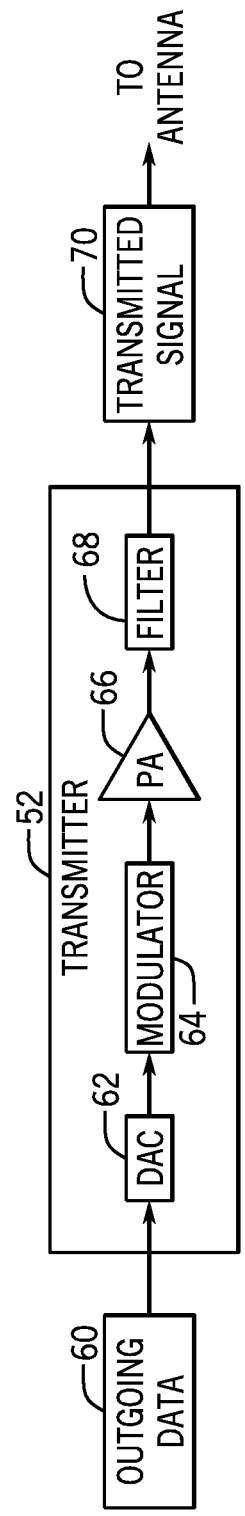
FIG. 4 is a schematic diagram of a transmitter of the electronic device of FIG. 1, according to embodiments of the present disclosure.

FIG. 4 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

Figure 5:
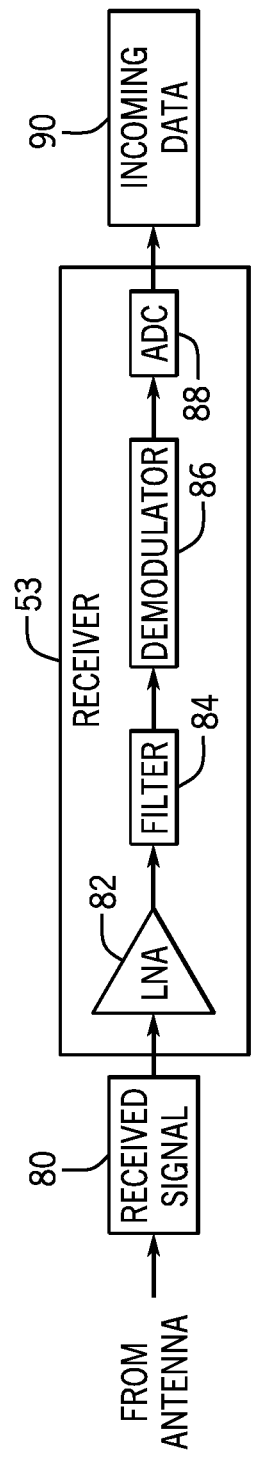
FIG. 5 is a schematic diagram of a receiver of the electronic device of FIG. 1, according to embodiments of the present disclosure.

FIG. 5 is a schematic diagram of the receiver 53 (e.g., receive circuitry), according to embodiments of the present disclosure. As illustrated, the receiver 53 may receive received signal 80 from the one or more antennas 55 in the form of an analog signal. A low noise amplifier (LNA) 82 may amplify the received analog signal to a suitable level for the receiver 53 to process. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 84 may be referred to as part of the RFFE, and more specifically, a receiver front end (RXFE) of the electronic device 10.

A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 53 may include any suitable additional components not shown, or may not include certain of the illustrated components, such that the receiver 53 may receive the received signal 80 via the one or more antennas 55. For example, the receiver 53 may include a mixer and/or a digital down converter.

Figure 6:
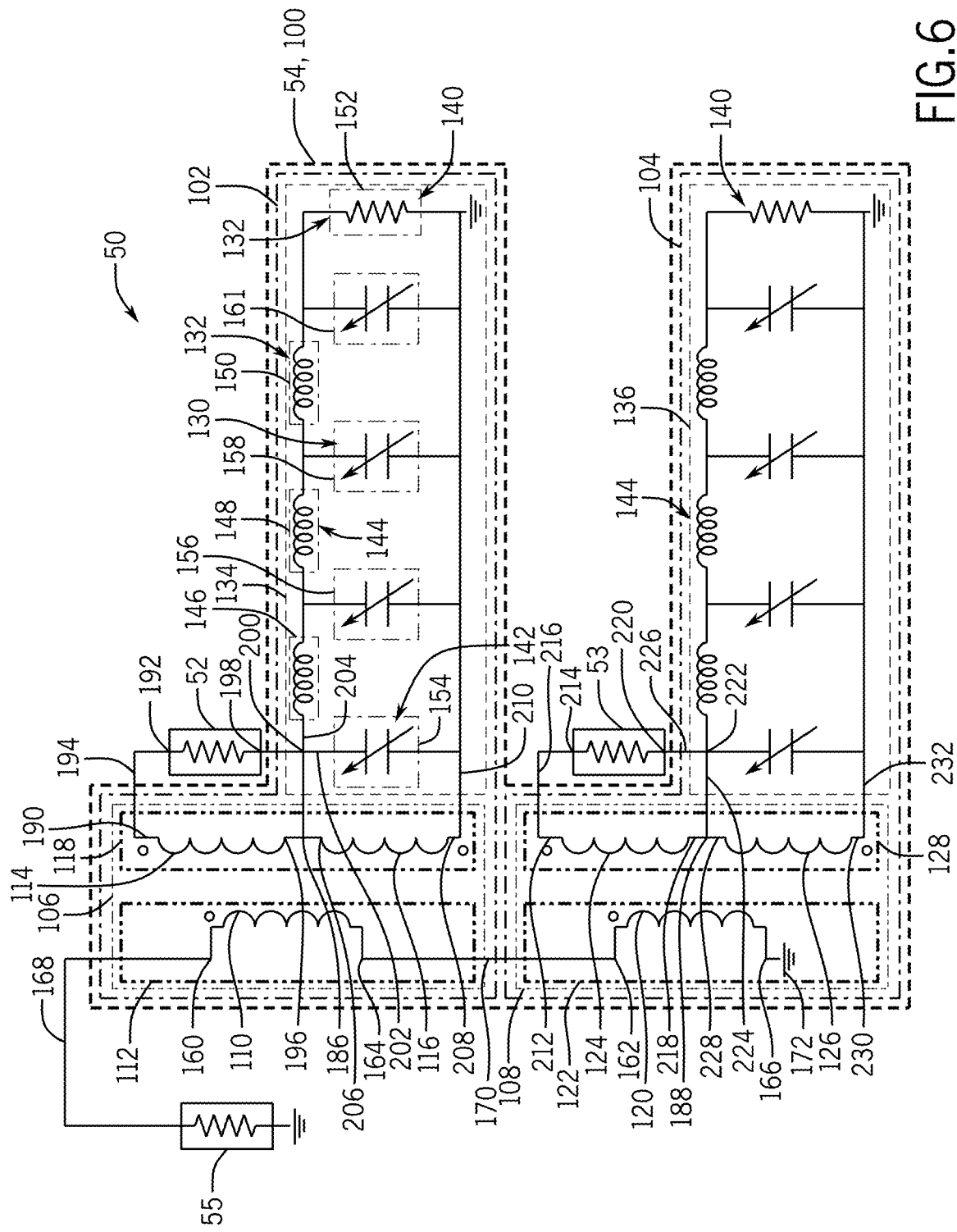
FIG. 6 is a circuit diagram of the RFFE of FIG. 3 having a double balanced duplexer coupling transmitter isolation circuitry and receiver isolation circuitry in series, according to embodiments of the present disclosure.

FIG. 6 is a circuit diagram of the RFFE, 50 having a duplexer that includes the transmitter isolation circuitry 102 that isolates the transmitter 52 from received signals of the first frequency range, and the receiver isolation circuitry 104 that isolates the receiver 53 from transmission signals of the second frequency range, according to embodiments of the present disclosure. The duplexer may be an example of the isolation circuitry 54, and is illustrated as a differential double balanced duplexer (dDBD) 100, though the isolation circuitry 54 may include any suitable duplexer used to isolates wireless signals between the transmitter 52 and the receiver 53, such as a phase balanced duplexer (PBD), Wheatstone balanced duplexer (WBD), an electrical balanced duplexer (EBD), a circular balanced duplexer (CBD), and so on.

As illustrated in FIG. 6, the dDBD 100 (e.g., a differential double balanced duplexer (dDBD), frequency division duplexer) may use a combination of various components in differential and single-ended configurations to isolate wireless signals of varying frequency ranges between the transmitter 52 and the receiver 53. In particular, the differential configuration may include a differential input having a first (e.g., high) input and a second (e.g., low) input, where differential voltage is floating because there is no reference to ground, and is measured as a difference between the first and second inputs. Whereas, a single-ended configuration may include a single (e.g., positive) input and a ground, where single-ended voltage is measured as a difference between the single input and the ground. The differential and the single-ended configurations (e.g., components) of the dDBD 100 will be discussed further in regards to FIGS. 8 and 9. Furthermore, as illustrated in FIG. 6, the dDBD 100 includes the transmitter isolation circuitry 102 that includes a transmitter balun 106 and the receiver isolation circuitry 104 that includes a receiver balun 108. Each of the baluns (e.g., the transmitter balun 106 and the receiver balun 108) may include one or more windings that, in operation, may electromagnetically couple to enable a signal to traverse the respective balun. For example, the transmitter balun 106 includes a primary winding 110 disposed on a primary side 112 (e.g., a first portion) of the transmitter balun 106 (e.g., coupled to the antenna 55) that, when current is applied, may electromagnetically couple to a first secondary winding 114 and a second secondary winding 116 disposed on a secondary side 118 (e.g., a second portion) of the transmitter balun 106 (e.g., coupled to the transmitter 52). The transmitter balun 106 may selectively pass a first signal (e.g., having a transmission frequency) from the transmitter 52 to the antenna 55, such that the first signal is passed (e.g., transmitted) from the first and second secondary windings 114, 116 and induced in the primary winding 110 of the transmitter balun 106. Similarly, the receiver balun 108 includes a primary winding 120 disposed on a primary side 122 of the receiver balun 108 (e.g., coupled to the antenna 55) that, in operation, may electromagnetically couple to a first secondary winding 124 and a second secondary winding 126 disposed on a secondary side 128 of the receiver balun 108 (e.g., coupled to the receiver 53). The receiver balun 108 may selectively pass a second signal (e.g., having a receive frequency) from the antenna 55 to the receiver 53, such that the second signal is passed from the primary winding 120 of the receiver balun 108 and induced in the first and second secondary windings 124, 126.

However, insertion loss may occur from transmission signals transmitted from the transmitter 52 to the antenna(s) 55 leaking into the receiver 53 and/or received signals received at the antenna(s) leaking to the transmitter 52, due to components (e.g., resistive devices such as resistors, inductive devices such as inductors, capacitive devices such as capacitors, and so on) of the duplexer 100 not acting in an ideal or as-designed manner. This may be due to environmental factors (e.g., temperature surrounding the electronic device 10, obstructions to the antenna(s)), age of the duplexer 100, manufacturing imperfections of the components of the duplexer 100, and so on. Additionally, sufficient isolation (e.g., low insertion loss) may be limited to a substantially narrow (e.g., small, limited) range of frequencies of the wireless signals. Moreover, the inclusion of additional elements in an attempt to produce effective isolation (e.g., blockers for handling high input power) may increase a footprint (e.g., size, dimensions) of the isolation circuitry 54 within the electronic device 10.

Accordingly, as illustrated in FIG. 6, the dDBD 100 may include a tuneable differential double balanced duplexer, such that the transmitter isolation circuitry 102 and the receiver isolation circuitry 104 may include one or more impedance tuners that selectively block or pass signals travelling (e.g., transmitting) via a corresponding path (e.g., between the antenna 55 and the receiver 53, between the antenna 55 and the transmitter 52, or both). In particular, the one or more impedance tuners may include one or more tunable components 130 and/or one or more fixed components 132 that, in combination, produce or output one or more impedance gradients. It should be understood that the one or more tunable components 57 with respect to FIG. 2 may include the one or more tunable components 130. Furthermore, for example, as illustrated in FIG. 6, the transmitter isolation circuitry 102 includes a transmitter impedance tuner (TX IT) 134 that may couple to the second secondary winding 116 of the transmitter balun 106 and to the transmitter 52. That is, in operation, the TX IT 134 may electrically couple a transmitter impedance gradient to the transmitter balun 106 and the transmitter 52 based on or by employing the one or more tunable components 130 and/or the one or more fixed components 132. In addition, the transmitter 52 may additionally couple to the first secondary winding 114 of the transmitter balun 106. Similarly, as illustrated in FIG. 6, the receiver isolation circuitry 104 includes a receiver impedance tuner (RX IT) 136 that may couple to the second secondary winding 126 of the receiver balun 108 and to the receiver 53. That is, in operation, the RX IT 136 may electrically couple a receiver impedance gradient to the receiver balun 108 and the receiver 53 based on or by employing the one or more tunable components 130 and/or the one or more fixed components 132. In addition, the receiver 53 may additionally couple to the first secondary winding 124 of the receiver balun 108.

The one or more tunable components 130 and the one or more fixed components 132 of the TX IT 134 and/or the RX IT 136 may be implemented as discrete lumped components and/or distributed components. Additionally, the one or more tunable components 130 may be adjusted, and, in combination with the one or more fixed components 132, may provide or output desired impedances (e.g., high impedances that approach or act like an open circuit) that block signals of a first frequency range and/or desired impedances (low impedances that approach or act like a short circuit) that enable signals of a second frequency range to pass through (e.g., coupling those signals to ground 136). Thus, a state of the one or more tunable components 130 and/or one or more fixed components 132 may define insertion loss for signals passing from the transmitter 52 to the antenna 55 and/or signals passing from the antenna 55 to the receiver 53, respectively. As discussed herein, the present embodiments provide for increased isolation between the receiver 53 and the transmitter 52, decreased insertion loss between the transmitter 52 and the antenna 55, and low insertion low between the antenna 55 and the receiver 53 by the present structure of the dDBD 100 and an impedance state of the TX IT 134 and/or the RX IT 136. Specifically, relatively high isolation and relatively low insertion loss may be achieved by a single-ended to differential isolation of the baluns (e.g., the transmitter balun 106, the receiver balun 108). Additionally, the present embodiments provide a wide bandwidth frequency isolation (e.g., high isolation) over a relatively large frequency range (e.g., high attenuation in mode conversion scattering parameters (S-parameters) may be used to provide the wide bandwidth isolation over the large frequency range).

It should be appreciated that the one or more tunable components 130 and/or the one or more fixed components 132 of the TX IT 134 and/or the RX IT 136 may include one or more resistive components (e.g., resistors 140), one or more capacitive components (e.g., capacitors 142), and/or one or more inductive components (e.g., inductors 144). For example, as illustrated in FIG. 6, the TX IT 134 includes the one or more fixed components 132, such as a first inductor 146, a second inductor 148, a third inductor 150, and a first resistor 152. Further, the TX IT 134 includes the one or more tunable components 130, such as a first variable capacitor 154, a second variable capacitor 156, a third variable capacitor 158, and a fourth variable capacitor 161. The RX IT 136 is illustrated to include similar fixed and tunable components. The one or more tunable components 130 may be configured (e.g., adjusted, tuned) to produce a certain set value (e.g., a low capacitance value between 0.1 picofarads (pF) and 4.0 pF (e.g., 0.19 pF, 3.7 pF, 0.1-0.2 pF, 3.0-4.5 pF, a high capacitance value between 20 pF and 35 pF, and so on) based on transmission frequencies of transmitted signals and/or receive frequencies of received signals.

Regardless of implementation type, the TX IT 134 and/or the RX IT 136 may act as filters having a relative high impedance mode (e.g., acting as an open circuit) in a "block" band compared to a relative low impedance mode (e.g., acting as a shorted line coupled to ground) in a "pass" band. Generally, the impedance provided by the high impedance mode is higher than the impedance provided by the low impedance mode. In particular, the impedance provided by the high impedance mode approaches an infinite impedance (e.g., such that it blocks signals or current at a first desired frequency range) and the impedance provided by the low impedance mode approaches zero impedance (e.g., such that it passes through signals or current at a second desired frequency range). However, certain circuits may have particular impedance values. For example, low impedances may equal approximately 50Ω or less (e.g., 40-60Ω) and high impedances may equal approximately 100Ω or more (e.g., 90-110Ω). In this way, each of the one or more tunable components 130 of the TX IT 134 and/or the RX IT 136 may include some combination of capacitances, inductances, resistances, switching circuitry, or the like to permit some frequencies (or frequency ranges) to pass through the transmitter balun 106 and/or the receiver balun 108 without permitting other frequencies to pass through (or frequency ranges).

Each of the TX IT 134 and/or the RX IT 136 may permit an active form of filtering, where a controller (e.g., the processor 12) may tune or adjust the one or more tunable components 130 (e.g., based on tuning states and/or the tuning algorithm 58 stored in the memory 14 and/or the storage 16) to enable some signals in a frequency range (e.g., at a certain frequency) to transmit to an open circuit (e.g., not permitted to pass) and some signals in another frequency range (e.g., at another certain frequency) to transmit to a short circuit or a closed circuit (e.g., permitted to pass). That is, the dDBD 100 may receive control signals from the controller (e.g., processor 12, memory 14) to set (e.g., tune, change, adjust) the one or more tunable components 130 of the TX IT 134 and/or the RX IT 136 to cause the TX IT 134 and/or the RX IT 136 to operate in the low impedance mode and/or in the high impedance mode (e.g., enable the TX IT 134 and/or the RX IT 136 to switch between operating in the low impedance mode to operating in the high impedance mode, and vice versa).

By leveraging the different impedances produced by the TX IT 134 and/or the RX IT 136, signals may be guided to transmit through one path as opposed to another. For example, transmission signals generated by the transmitter 52 that traverse the transmitter balun 106 may be transmitted via the antenna 55. However, in some instances, a portion of the signals that traverse the transmitter balun 106 may be of suitable frequency range or may generate signals of suitable frequency range to also traverse the receiver balun 108. To ensure effective transmission of the signals without unintentional leakage of the portion of the signals across the receiver balun 108, this portion of the signals may be blocked by the RX IT 136 (e.g., by an impedance produced by the one or more tunable components 130 and the one or more fixed components 132 of the RX IT 136) while transmit operation occurs. That is, while the transmit operation occurs (e.g., transmitting signals in the transmission frequency range), an impedance associated with the RX IT 136 (e.g., an impedance associated with traversing the receiver balun 108) may be greater than an impedance of the antenna 55 to increase a likelihood that substantially all portions of signals in the transmission frequency range are blocked.

Similarly, the antenna 55 may receive signals and the received signals may transmit through the receiver balun 108 for provision to the receiver 53. However, in some instances, a portion of the received signals may be of suitable frequency range or may generate signals of suitable frequency range to also traverse the transmitter balun 106. To ensure effective reception of the received signals without unintentional leakage of the portion of the signals across the transmitter balun 106, this portion of the signals may be blocked by the TX IT 134 (e.g., by an impedance produced by the one or more tunable components 130 and the one or more fixed components 132 of the TX IT 134) while receive operation occurs. That is, while the receive operation occurs (e.g., receiving signals in the receive frequency range), an impedance associated with the TX IT 134 (e.g., an impedance associated with traversing the transmitter balun 106) may be greater than an impedance associated with the RX IT 136. Further, although the impedance of the RX IT 136 may be of any suitable value, the impedance associated with the RX IT 136 during the receive operation may correspond to a lower impedance than an impedance at the TX IT 134. In this way, the impedance associated with the TX IT 134 may increase the likelihood that substantially all portions of signals in the receive frequency range are blocked from leaking into the transmitter 52.

It is noted that the dDBD 100 may operate in a full duplexer mode or a half duplexer mode and/or may operate as a frequency division duplex (FDD) system and/or as a time division duplex (TDD) system. The dDBD 100 may operate to transmit and receive signals at the same time (e.g., concurrently or simultaneously) during the full duplexer mode (e.g., FDD system) and may operate to transmit signals at a different time than receiving signals during the half duplexer mode (e.g., TDD system). In this way, the dDBD 100 may use a separate frequency band (e.g., received signals of the first frequency range) for the receive operation than for the transmit operation (e.g., transmission signals of the second frequency range) when operating as an FDD system. In some embodiments, the dDBD 100 may use a same frequency band for the receive operation and the transmit operation when operating as a TDD system, relying on time to separate the signals for each operation.

When the dDBD 100 is operating in the full duplexer mode, circuitry associated with the receiver balun 108 (e.g., the RX IT 136) may operate to filter out signals associated with the transmit operation while circuitry associated with the transmitter balun 106 (e.g., the TX IT 134) may operate to filter out signals associated with the receive operation. For example, similarly as discussed herein, the TX IT 134 may block signals in a receive operation frequency range (e.g., a first frequency range) and pass signals in a transmit operation frequency range (e.g., a second frequency range). Thus, when describing operation of the TX IT 134 and the RX IT 136 from a perspective of the transmit operation, the TX IT 134 may be described as being in a low impedance mode (e.g., closed circuit mode, low impedance state) and the RX IT 136 may be described as being in a high impedance mode (e.g., open circuit mode, high impedance state) relative to frequency ranges used for the transmit operation. However, when describing operation of the TX IT 134 and the RX IT 136 from a perspective of the receive operation, the TX IT 134 may be described as being in the high impedance mode and the RX IT 136 may be describe as being in the low impedance mode relative to frequency ranges used for the receive operation. In other words, when operating in a full duplexer mode, the TX IT 134, and thus the transmitter balun 106, may have a first impedance (e.g., high impedance when operating in a high impedance mode) with respect to the first frequency range associated with the received wireless signals and may have a second impedance (e.g., low impedance when operating in the low impedance mode) with respect to the second frequency range associated with the transmitted wireless signals. While the RX IT 136, and thus the receiver balun 108, may have a first impedance (e.g., low impedance when operating in a low impedance mode) with respect to the first frequency range associated with the received wireless signals and may have a second impedance (e.g., high impedance when operating in the high impedance mode) with respect to the second frequency range associated with the transmitted wireless signals. In this way, the receive operation and transmit operation may have inverse impedance modes of operation of the TX IT 134 and the RX IT 136. Further, during operation, the inverse impedance modes of the TX IT 134 and the RX IT 136 may enable signals in the receive frequency range (e.g., the first frequency range) to transmit from the antenna 55 through the receiver balun 108 and to the receiver 53 as opposed to through the transmitter balun 106 and to the transmitter 52. Similarly, during operation, the inverse impedance modes may enable signals in the transmit frequency range (e.g., the second frequency range) to transmit from the transmitter 52 through the transmitter balun 106 and to the antenna 55 as opposed to through the receiver balun 108 and to the receiver 53. Thus, by including both the TX IT 134 and the RX IT 136 in the dDBD 100, insertion loss of the RFFE 50 may be reduced and isolation of the wireless signals of the transmit frequency range (e.g., the second frequency range) from the receiver 53 and isolation of the wireless signals of the receive frequency range (e.g., the first frequency range) from the transmitter 52 may be substantially increased across a substantially wide bandwidth frequency range.

Turning to the structure (e.g., couplings, connections, electrical couplings) of the dDBD 100 illustrated in FIG. 6 that enables enhanced isolation performance (e.g., relatively low insertion loss, relatively high isolation across a substantially wide bandwidth frequency range) of the dDBD 100, the transmitter balun 106 and the receiver balun 108 each include a first port 160, 162 and a second port 164, 166, respectively, wherein the first ports 160, 162 and the second ports 164, 166 of the transmitter and receiver baluns 106, 108 are coupled (e.g., directly coupled, without intermediate or intervening components) to the primary windings 110, 120 of the transmitter and receiver baluns 106, 108, respectively. In particular, the antenna 55 is coupled to the first port 160 of the transmitter balun 106 (e.g., to the primary winding 110 of the transmitter balun 106) via a node 168 and the second port 164 of the transmitter balun 106 (e.g., of the primary winding 110 of the transmitter balun 106) is coupled to the first port 162 of the receiver balun 108 (e.g., to the primary winding 120 of the receiver balun 108) in series (e.g., in a series version/configuration of the dDBD 100) via a node 170. The second port 166 of the receiver balun 108 (e.g., the primary winding 120 of the receiver balun 108) may be additionally coupled to a ground 172. That is, the dDBD 100 of FIG. 6 is in a series configuration. In addition, the sequence of the transmitter and receiver baluns 106, 108 in connection to the antenna 55 and to the ground 172 in series may be different. In particular, the second port 164 of the transmitter balun 106 may be connected to the ground 172 and the first port 160 of the transmitter balun 106 may be connected to the second port 166 of the receiver balun 108, while the first port 162 of the receiver balun 108 may be connected to the antenna via the node 168. While FIG. 6 illustrates two baluns connected in a series to the antenna 55, it should be understood that the RFFE 50 may include more than two baluns connected in a series to the antenna 55. For example, the RFFE 50 may include more than one receiver balun 108 and more than one transmitter balun 106. In particular, each additional balun may be connected to the transmitter and receiver isolation circuitry 102, 104, respectively, and/or to other circuitry components of the RFFE 50. In this way, the additionally baluns may enable the RFFE 50 (e.g., the dDBD 100) to include additional functions (e.g. use of additional transmitters 52, use of additional receivers 53, measurements of the RFFE 50, analog or digital cancellation circuitry, etc.)

Figure 7:
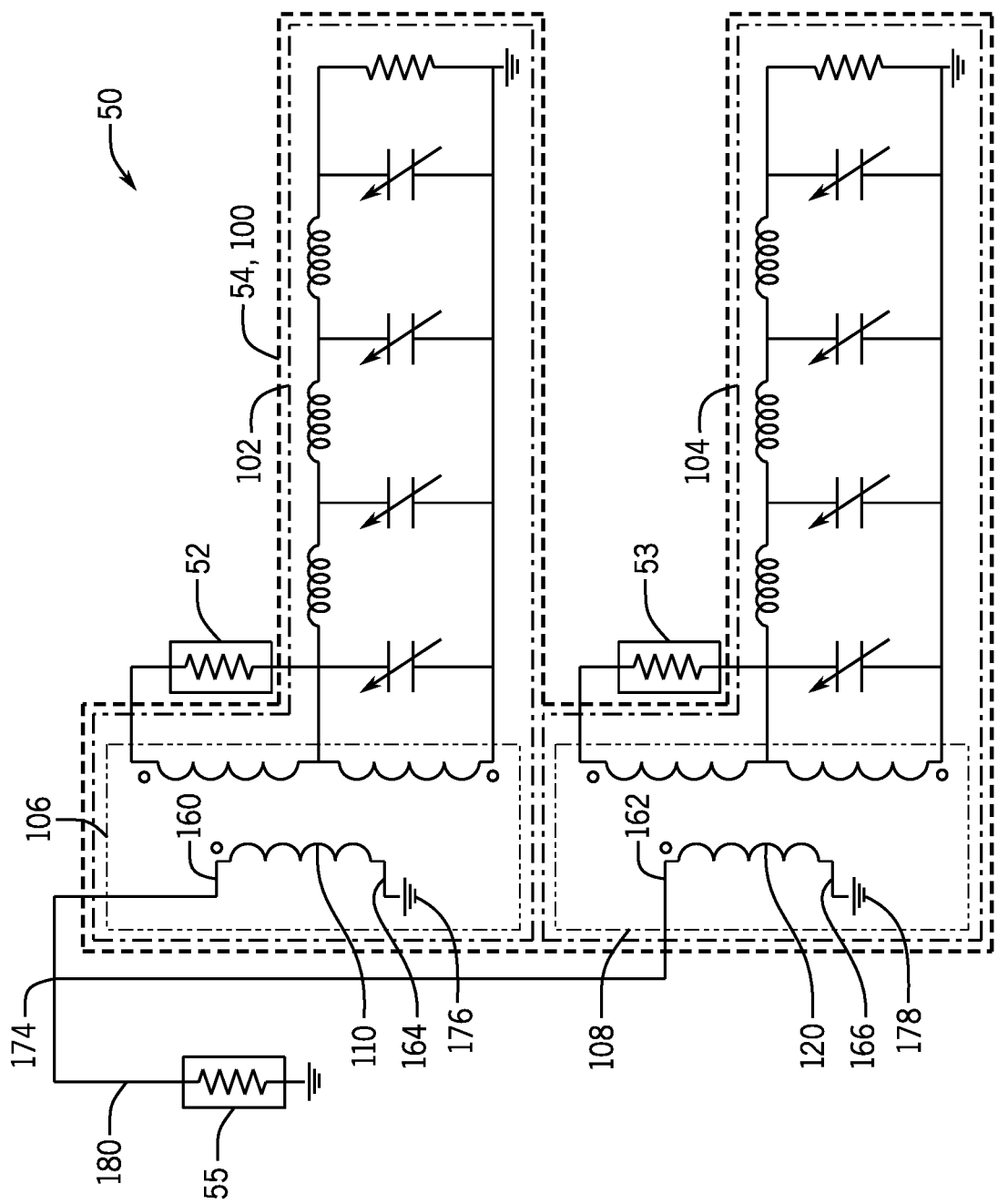
FIG. 7 is a circuit diagram of the RFFE of FIG. 3 having the double balanced duplexer with the transmitter isolation circuitry and the receiver isolation circuitry coupled to an antenna in parallel, according to embodiments of the present disclosure.

Furthermore, FIG. 7 illustrates an alternative embodiment of the circuit diagram of FIG. 6 having the antenna 55 coupled to the dDBD 100 (e.g., the transmitter isolation circuitry 102 with the transmitter 52 and the receiver isolation circuitry 104 with the receiver 53) in a parallel configuration (e.g., parallel version). In particular, the parallel configuration of the isolation circuitry 54 includes the first port 160 of the transmitter balun 106 (e.g., of the primary winding 110 of the transmitter balun 106) coupled to the antenna 55 via a node 174 (e.g., a T-junction) and the first port 162 of the receiver balun 108 (e.g., of the primary winding 120 of the receiver balun 108) coupled to the antenna 55 via the node 174. Thus, the antenna 55 is coupled to both the first ports 160, 162 of the transmitter balun 106 and the receiver balun 108, respectively, via the node 174. Further, the second ports 164, 166 of the transmitter and receiver baluns 106, 108 (e.g., of the primary windings 110, 120 of the transmitter and receiver baluns 106, 108) may each be coupled to a respective first and second ground 176, 178. While FIG. 7 illustrates two baluns connected in parallel to the antenna 55, it should be understood that the RFFE 50 may include more than two baluns connected in parallel to the antenna 55. For example, the RFFE 50 may include more than one receiver balun 108 and more than one transmitter balun 106. In particular, each additional balun may be connected to the transmitter and receiver isolation circuitry 102, 104, respectively, and/or to other circuitry components of the RFFE 50. In this way, the additionally baluns may enable the RFFE 50 (e.g., the dDBD 100) to include additional functions (e.g. use of additional transmitters 52, use of additional receivers 53, measurements of the RFFE 50, analog or digital cancellation circuitry, etc.)

FIG. 6 illustrates embodiments of the circuit diagram of the isolation circuitry 54 (e.g., dDBD 100) of the RFFE 50 in the series version, while FIG. 7 illustrates embodiments of the circuit diagram of FIG. 6 including the isolation circuitry 54 (e.g., dDBD 100) of the RFFE 50 in the parallel version. Regardless of the parallel or series configurations, the isolation circuitry 54 of both the parallel and series configurations operate similarly to isolate the transmitter 52 from the received signals of the first frequency range, and the receiver 53 from the transmission signals of the second frequency range. Furthermore, as illustrated in FIGS. 6 and 7, the isolation circuitry 54 of the parallel and series configurations includes similar components and circuit structure (e.g., similar couplings). For example, each of the transmitter and receiver balun 106, 108 includes the respective secondary side 118, 128 that each includes a respective first secondary winding 114, 124 and a respective second secondary winding 116, 126 coupled (e.g., electrically coupled, directly coupled, without intermediate or intervening components) to each other via a respective center tap 186, 188 (e.g., node). Furthermore, the first secondary windings 114, 124 of the transmitter and receiver baluns 106, 108 each include a respective first turning ratio (e.g., a first winding direction). In addition, the second secondary windings 116, 126 of the transmitter and receiver baluns 106, 108 each include a respective second turning ratio (e.g., a second winding direction) that is different (e.g., inverse, greater, less) than the first turning ratio. Moreover, the first secondary winding 114 of the transmitter balun 106 includes a first port 190 coupled to a first port 192 of the transmitter 52 via a node 194. The first secondary winding 114 of the transmitter balun 106 also includes a second port 196 coupled to the center tap 186 of the transmitter balun 106. The center tap 186 is additionally coupled to a second port 198 of the transmitter 52 via a node 200 of the transmitter isolation circuitry 102 (e.g., an X-junction, cross-junction). Additionally, the node 200 enables the TX IT 134 to be coupled to both the transmitter 52 and the center tap 186 of the transmitter balun 106. Specifically, the TX IT 134 is coupled to the node 200 via a first and a second signal pathway (e.g., circuit path, current path) 202, 204 and the second port 198 of the transmitter 52 is coupled to the node 200. Furthermore, the second secondary winding 116 includes a first port 206 coupled to the center tap 186 and a second port 208 coupled to the TX IT 134 via node 210.

Similarly, the first secondary winding 124 of the receiver balun 108 includes a first port 212 coupled to a first port 214 of the receiver 53 via a node 216. The first secondary winding 124 of the receiver balun 108 also includes a second port 218 coupled to the center tap 188 of the receiver balun 108. The center tap 188 is additionally coupled to a second port 220 of the receiver 53 via a node 222 of the receiver isolation circuitry 104 (e.g., an X-junction, cross-junction). Additionally, the node 222 enables the RX IT 136 to be coupled to both the receiver 53 and the center tap 188 of the receiver balun 108. Specifically, the RX IT 136 is coupled to the node 222 via a third and a fourth signal pathway (e.g., circuit path, current path) 224, 226 and the second port 220 of the receiver 53 is coupled to the node 222. Furthermore, the second secondary winding 126 of the receiver balun 108 includes a first port 228 coupled to the center tap 188 and a second port 230 coupled to the RX IT 136 via a node 232.

Figure 8:
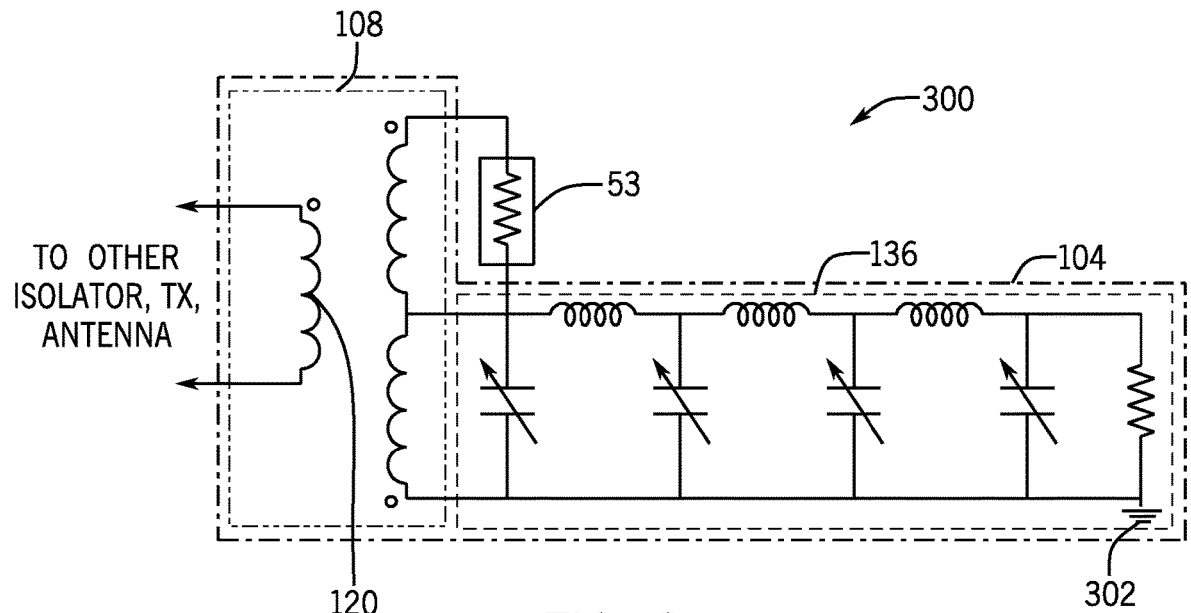
FIG. 8 is a circuit diagram of a receive portion of the RFFE of FIG. 3 with a differential receiver and a single-ended receiver impedance tuner, according to embodiments of the present disclosure.
Figure 9:
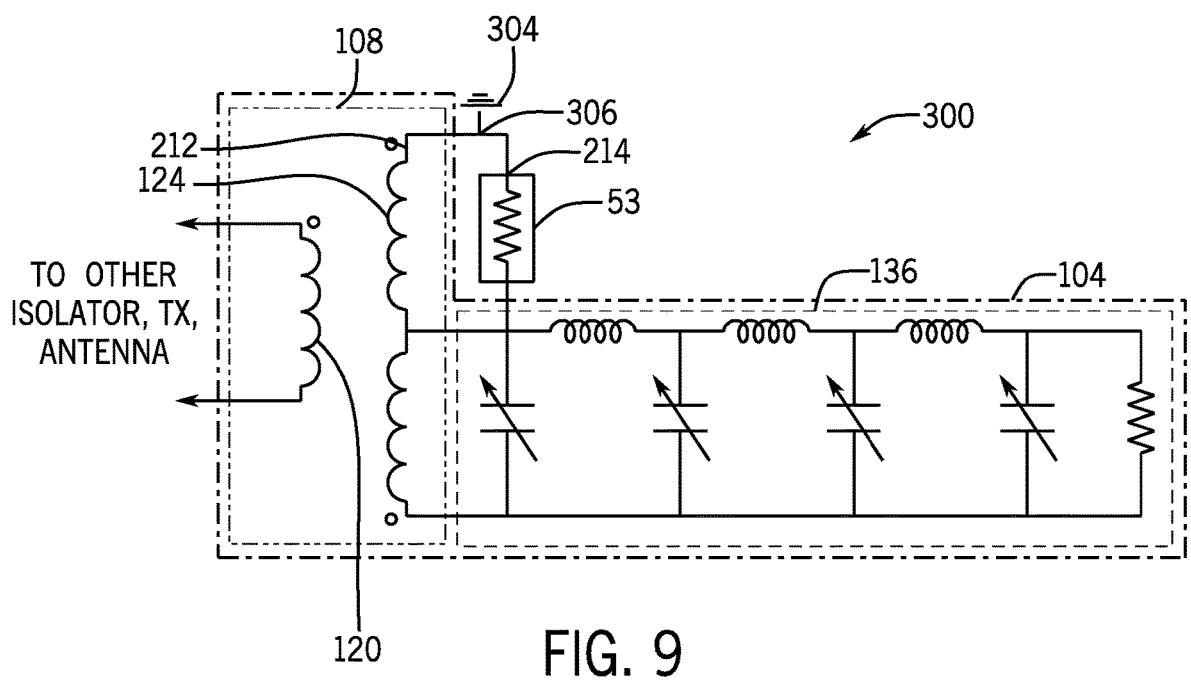
FIG. 9 is a circuit diagram of a receive portion of the RFFE of FIG. 3 with a single-ended receiver and a differential receiver impedance tuner, according to embodiments of the present disclosure.

FIGS. 8 and 9 are alternative embodiments of circuit diagrams of a receive portion 300 (e.g., receiver isolation circuitry 104) of the RFFE 50 (e.g., the dDBD 100, the isolation circuitry 54) of FIG. 3 with a combination of single-ended component(s) and differential component(s) that enable the receive portion 300 to isolate the receiver 53 from transmitted signals from the transmitter 52 and to decrease insertion loss of received signals from the antenna 55 to the receiver 53. As an example, FIG. 8 is a circuit diagram of the receive portion 300 of the dDBD 100 with a differential receiver 53 and a single-ended RX IT 136. In particular, the single-ended RX IT 136 includes a coupling to a ground 302, while the differential receiver 53 is a closed loop that does not include a ground connection. Alternatively, FIG. 9 is a circuit diagram of the receive portion 300 of the dDBD 100 with a single-ended receiver 53 and a differential RX IT 136. In particular, the first port 214 of the receiver 53 and the first port 212 of the first secondary winding 124 of the receiver balun 108 are coupled to a ground 304 via a node 306. Additionally, the differential RX IT 136 is a closed loop that does not include a ground connection. In this embodiment, the single-ended receiver 53 (and/or the single-ended transmitter 52) may be implemented into the isolation circuitry 54 (e.g., the dDBD 100) without use of a differential amplifier (e.g., a low-noise amplifier (LNA), a power amplifier (PA)). Additionally, the differential RX IT 136 (e.g., and/or the differential TX IT 134) may be easily integrated into existing systems (e.g., existing RFFEs 50) dependent on the existing components of the RFFE 50. In alternative embodiments, the ground connection may be coupled to a center tap (e.g., respective center taps 186, 188 of the transmitter and/or receiver baluns 106, 108). Still other embodiments may not implement a ground connection into the dDBD 100 (e.g., the isolation circuitry 54).

While FIGS. 8 and 9 illustrate the receive portion 300 of the dDBD 100 (e.g., receiver isolation circuitry 104), in some embodiments, a transmitter portion of the dDBD 100 (e.g., the transmitter isolation circuitry 102) may additionally or alternatively include single-ended and differential components. For example, in certain embodiments, the transmitter portion may comprise the transmitter balun 106 coupled to a single-ended transmitter 52 and a differential TX IT 134. In particular, the first port 192 of the transmitter 52 (e.g., single-ended transmitter 52) and the first port 190 of the first secondary winding 114 of the transmitter balun 106 may be coupled to a ground via a node. Further, the TX IT 134 (e.g., differential TX IT 134) may be a closed loop that does not include a ground connection. Alternatively, in certain embodiments, the transmitter balun 106 may be coupled to a differential transmitter 52 and a single-ended TX IT 134. In particular, the TX IT 134 (e.g., single-ended TX IT 134) may be coupled to a ground, while the transmitter 52 (e.g., differential transmitter 52) is a closed loop that does not include a ground connection. For example, the single-ended TX IT 134 may be coupled to the ground via a node.

In any of the alternative embodiments, the single-ended to differential configurations of the transmitter isolation circuitry 102 and the receiver isolation circuitry 104 enable the relatively high isolation between the received signals at the first frequency range and the transmitted signals at the second frequency range with respect to the receiver balun 108 (e.g., the receiver 53) and the transmitter balun 106 (e.g., transmitter 52), respectively. It should be understood that the position (e.g., connection, coupling, location) of the ground on the receiver portion 300 and/or the transmitter portion of the dDBD 100 may be in any position that enables the transmitter balun and/or the receiver balun 106, 108 to each include a single-ended to differential electrical configuration (e.g., coupling). That is, a position (e.g., connection, coupling, location) of the ground may be at the center tap of a balun (e.g., the transmitter balun 106 and/or the receiver balun 108), inside one or more windings of the one or more baluns, outside one or more windings of the one or more baluns, within the TX IT 134 and/or the RX IT 136 circuitry, etc.

Figure 10:
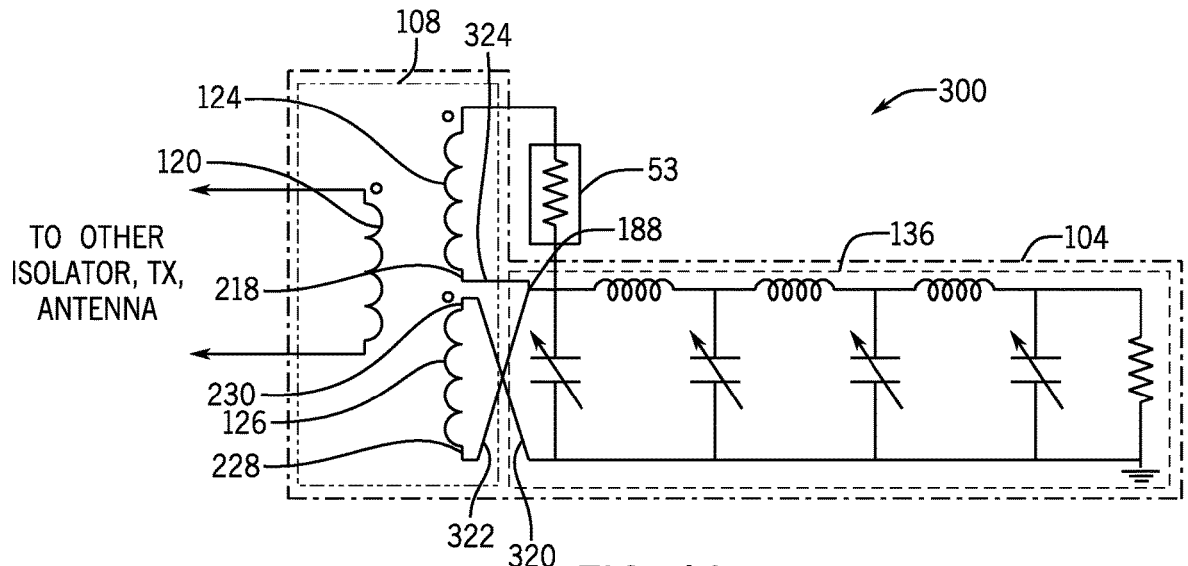
FIG. 10 is a circuit diagram of a receive portion of the RFFE of FIG. 3 with an inverted winding of a receiver balun, according to embodiments of the present disclosure.

FIG. 10 is a circuit diagram of the receive portion 300 of the RFFE, 50 of FIG. 3 with an inverted winding of a receiver balun, according to embodiments of the present disclosure. In particular, the second secondary winding 126 of the receiver balun 108 may be illustratively inverted yet maintain essentially the same couplings as FIG. 6. Indeed, the second secondary winding 126 with respect to FIG. 10 is reversed (e.g., a polarity of the second secondary winding 126 of FIG. 10 is reversed) compared to the second secondary winding 126 illustrated in FIG. 6. For example, as illustrated, the second port 230 of the second secondary winding 126 of the receiver balun 108 is coupled to the RX IT 136 via a node 320. Additionally, the first port 228 of the second secondary winding 126 of the receiver balun 108 may be coupled to the center tap 188 of the receiver balun 108 via a node 322. Furthermore, the first port 228 of the second secondary winding 126 of the receiver balun 108 may be coupled to the second port 218 of the first secondary winding 124 of the receiver balun 108 through the center tap 188 of the receiver balun 108. Similarly, the second port 218 of the first secondary winding 124 of the receiver balun 108 may be coupled to the center tap 188 of the receiver balun 108 via a node 324 and may be coupled to the first port 228 of the second secondary winding 126 of the receiver balun 108 through the center tap 188 (e.g., via the node 322).

It should be understood that any of the primary, first secondary, and/or second secondary windings of the transmitter balun 106 and/or the receiver balun 108 may be illustratively inverted and maintain essentially the same couplings as FIG. 6. Additionally, despite the illustrative differences, FIG. 9, and any embodiments comprising similar couplings, enable the transmitter isolation circuitry 102 and the receiver isolation circuitry 104 to produce relatively high isolation of the wireless signals of the transmit frequency range (e.g., the second frequency range) from the receiver 53 and relatively high isolation of the wireless signals of the receive frequency range (e.g., the first frequency range) from the transmitter 52 across a substantially wide bandwidth frequency range, while producing relatively low insertion loss of received signals of the first frequency across the receiver balun 108 to the receiver 53 (e.g., from the antenna 55) and transmitted signals of the second frequency across the transmitter balun 106 from the transmitter 52 (e.g., to the antenna 55), respectively.

Figure 11:
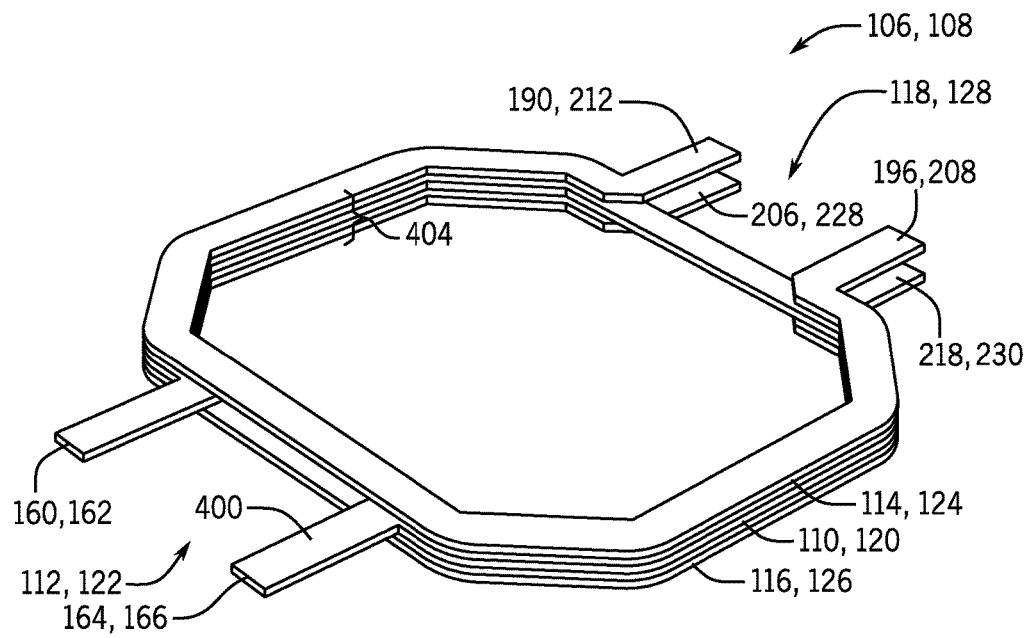
FIG. 11 is a schematic diagram of a balun of the double balanced duplexer of FIG. 6 having a stacked loop configuration, according to embodiments of the present disclosure.
Figure 12:
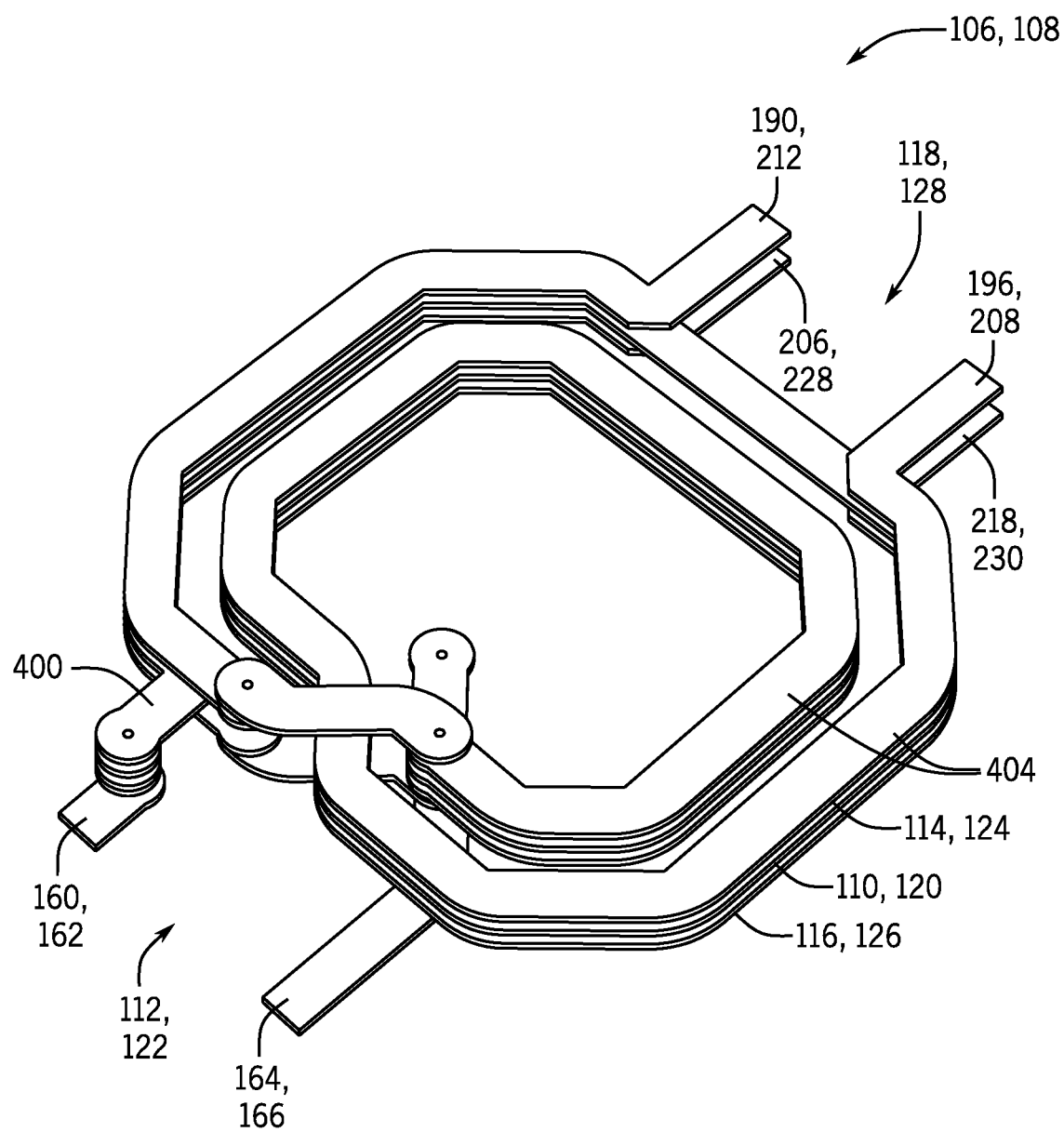
FIG. 12 is a schematic diagram of a balun of the double balanced duplexer of FIG. 6 having a stacked double loop, according to embodiments of the present disclosure.

FIGS. 11 and 12 each depict an example implementation of the transmitter and/or receiver balun 106, 108 of the dDBD 100 (e.g., isolation circuitry 54). It should be understood that the example implementations of FIGS. 11 and 12 are provided as examples, and it is contemplated that there are other suitable implementations (e.g., including more or less components than those illustrated) that serve to perform the same or similar tasks. As illustrated, the transmitter and/or receiver balun 106, 108 include the respective primary windings 110, 120 forming couplings on the respective primary sides 112, 122 of the transmitter and/or receiver balun 106, 108, the respective first secondary windings 114, 124 and the respective second secondary windings 116, 126 forming couplings on the respective secondary sides 118, 128 of the transmitter and/or receiver balun 106, 108. In particular, as illustrated in FIGS. 11 and 12, the primary windings 110, 120 are disposed in-between the first and the second secondary windings 114, 124 and 116, 126, where the first secondary windings 114, 124 are disposed adjacent or immediately proximate to, without contacting, a first face 400 of the primary windings 110, 120, and the second secondary windings 116, 126 are adjacent or immediately proximate to, without contacting, a second face 402 (not seen in FIG. 10) of the primary windings 110, 120 opposite the first face 400. Additionally, the primary windings 110, 120 include the respective first ports 160, 162 and the respective second ports 164, 166. Similarly, each of the respective first and the second secondary windings 114, 124 and 116, 126, include the respective first ports 190, 212 and 206, 228, and the respective second ports 196, 208 and 218, 230. Specifically, as illustrated in FIG. 11, the transmitter and/or receiver balun 106, 108 may include a single loop of stacked windings or coils 404 (e.g., configured to be electromagnetically coupled when current is running through the windings 404) formed by multiple hexagonal conductors. While FIG. 11 illustrates hexagonal conductors, the conductors may be any suitable geometrical shape (e.g., square, round, triangle, octagonal, etc.) In alternative or additional embodiments, the transmitter and/or receiver balun 106, 108 may include any number of loops of stacked windings or coils 404 (e.g., 2, 3, 4, 5) (e.g., configured to be electromagnetically coupled when current is running through the windings 404).

For example, FIG. 12 depicts an alternative example implementation of the transmitter and/or receiver balun 106, 108 that includes two loops of stack windings or coils 404 (e.g., configured to be electromagnetically coupled when current is running through the windings 404). It should be understood that FIG. 12 may include similar elements of the transmitter and/or receiver balun 106, 108 as illustrated in FIG. 11. Furthermore, the transmitter and/or receiver balun 106, 108 may include windings or coils 404 formed by any other viable shape (e.g., circular shapes, rectangular shapes, and so on). Moreover, various ports (e.g., the respective first ports 160, 162 and the respective second ports 164, 166 of the primary windings 110, 120 of the transmitter and/or receiver balun 106, 108, and/or the respective first ports 190, 212 and 206, 228, and the respective second ports 196, 208 and 218, 230 of the respective first and the second secondary windings 114, 124 and 116, 126 of the transmitter and/or receiver balun 106, 108) may have various configurations. In different embodiments, the various ports of the respective primary windings 110, 120, the respective first secondary windings 114, 124, and/or the respective second secondary windings 116, 126 of the transmitter and/or receiver balun 106, 108 may be positioned equidistant from one another, on a top half of a circular shape, split equally on opposite sides of a rectangular shape, at ends of two parallel lines, among other positions.

Figure 13:
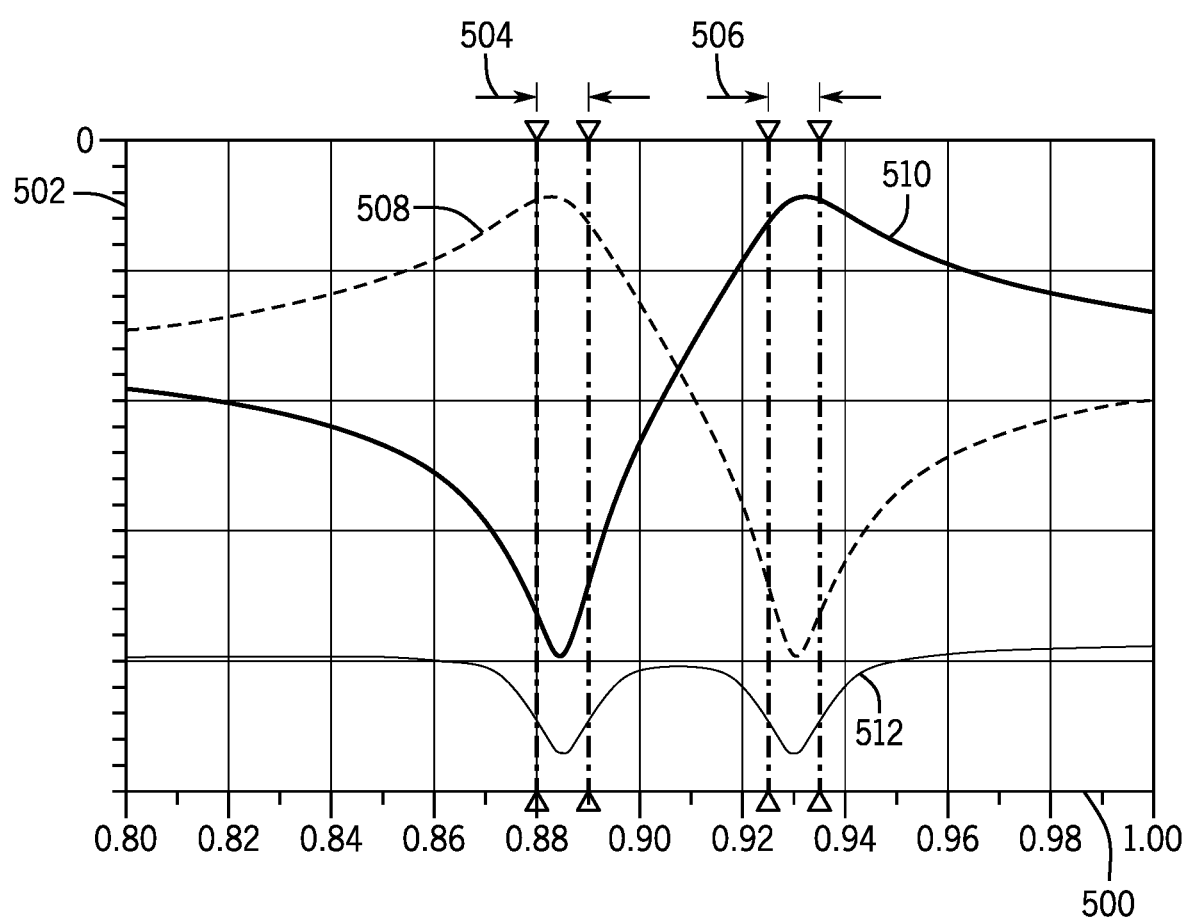
FIG. 13 is a plot illustrating effectiveness of the double balanced duplexer of FIG. 6 in terms of frequency and power, according to embodiments of the present disclosure.

FIG. 13 is a plot illustrating effectiveness of the dDBD 100 in terms of frequency and power, according to embodiments of the present disclosure. As illustrated, the plot includes a horizontal axis 500 representing frequency in gigahertz (GHz), and a vertical axis 502 representing power in decibels (dB). The receiver 53 of the electronic device 10 may be configured to receive wireless signals over a receive frequency range 504 (e.g., between 880 megahertz (MHz) and 890 MHz), and the transmitter 52 of the electronic device 10 may be configured to transmit wireless signals over a transmission frequency range 506 (e.g., between 925 MHz and 935 MHz). It should be understood that the frequency ranges 504, 506 shown in FIG. 13 are only examples, and any other suitable frequency ranges are contemplated (including where the receive frequency range 504 is greater than the transmission frequency range 506, as opposed to what is shown in FIG. 13).

By employing the dDBD 100, it may be observed that a receiver insertion loss 508 (e.g., from a received signal at the antenna(s) 55 leaking to the transmitter 52) may be decreased or minimized at the receive frequency range 504. For example, the receiver insertion loss 508 at the receive frequency range 504 may be −5 dB or greater, −6 dB or greater, −7 dB or greater, −8 dB or greater, and so on. Similarly, a transmission insertion loss 510 (e.g., from a transmitted signal sent by at the transmitter 52 leaking to the receiver 53) may be decreased or minimized at the transmission frequency range 506. For example, the transmission insertion loss 510 at the transmission frequency range 506 may be −5 dB or greater, −6 dB or greater, −7 dB or greater, −8 dB or greater, and so on. Additionally, an isolation 512 of the [disclosed embodiments, the duplexer 100, etc.] may be decreased or minimized at both the receive frequency range 504 and the transmission frequency range 506. For example, the isolation 512 at the receive frequency range 504 and the transmission frequency range 506 may be −40 dB or less, −43 dB or less, −44 dB or less, −45 dB or less, −50 dB or less, and so on. Moreover, as dDBD 100 exhibits isolation 512 across a wide bandwidth. That is, the isolation 512 is generally steady across the illustrated bandwidth of 800 MHz to 1 GHz, and indeed over a bandwidth greater than the illustrated bandwidth. For example, the isolation 512 may have a maximum value of −38 dB or less, −39 dB or less, −40 dB or less, and so on.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(t). However, for any claims containing elements designated in any other manner, it is intended that such elements are not to be interpreted under 35 U.S.C. 112(t).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A communication device, comprising:
one or more antennas;
communication circuitry; and
isolation circuitry coupling the one or more antennas to the communication circuitry, the isolation circuitry comprising,
    a first balun comprising a first portion and a second portion, the first portion coupled to the one or more antennas,
    a first impedance tuner coupled to the communication circuitry and to the second portion,
    a second balun comprising a third portion and a fourth portion, the third portion coupled to the one or more antennas, and
    a second impedance tuner coupled to a second communication circuitry and to the fourth portion.

2. The communication device of claim 1, wherein the communication circuitry is coupled to a ground, and the first impedance tuner comprises a differential input.

3. The communication device of claim 1, wherein the first impedance tuner is coupled to a ground, and the communication circuitry comprises a differential input.

4. The communication device of claim 1, wherein the communication circuitry comprises a transmitter and the second communication circuitry comprises a receiver.

5. The communication device of claim 4, wherein the first balun and the second balun are coupled to the one or more antennas in series.

6. The communication device of claim 1, the first portion of the first balun is configured to electromagnetically couple to the second portion of the first balun, the second portion comprising a first winding and a second winding coupled via a center tap.

7. The communication device of claim 6, wherein the first winding comprises a first turning ratio and the second winding comprises a second turning ratio different than the first turning ratio.

8. The communication device of claim 6, wherein the first winding comprises a first port and a second port, the first port coupling to the communication circuitry, the second port coupling to a first node via the center tap, and the communication circuitry coupling to the center tap via the first node.

9. The communication device of claim 6, wherein the second winding comprises a first port and a second port, the first port coupling to a first node via the center tap and the second port coupling to the first impedance tuner via a second node.

10. The communication device of claim 1, wherein the first balun and the second balun are coupled to the one or more antennas in parallel.

11. Isolation circuitry comprising:
a first balun comprising a first portion and a second portion, the first portion configured to couple to one or more antennas;
a first impedance tuner configured to couple to first communication circuitry and the second portion;
a second balun comprising a third portion and a fourth portion, the third portion configured to couple to the one or more antennas; and
a second impedance tuner coupled to second communication circuitry and to the fourth portion.

12. The isolation circuitry of claim 11, wherein the first balun and the second balun are coupled to one or more antennas in series.

13. The isolation circuitry of claim 11, wherein the first portion of the first balun is configured to electromagnetically couple to the second portion of the first balun, the second portion comprising a first winding and a second winding coupled via a center tap, and wherein the first winding comprises a first turning ratio and the second winding comprises a second turning ratio different than the first turning ratio.

14. The isolation circuitry of claim 13, wherein the first winding comprises a first port and a second port, the first port coupling to the first communication circuitry, the second port coupling to a first node via the center tap, and the first communication circuitry coupling to the center tap via the first node.

15. The isolation circuitry of claim 13, wherein the second winding comprises a first port and a second port, the first port coupling to a first node via the center tap and the second port coupling to the first impedance tuner via a second node.

16. The isolation circuitry of claim 11, wherein the first impedance tuner, the second impedance tuner, or both comprises a differential input.

17. The isolation circuitry of claim 11, wherein the first impedance tuner, the second impedance tuner, or both is coupled to a ground.

18. A radio frequency transceiver comprising:
communication circuitry; and
isolation circuitry comprising,
    a first balun comprising a first portion and a second portion, wherein the first portion is configured to electromagnetically couple to the second portion, and wherein the first portion is configured to couple to one or more antennas and the second portion comprises a first winding and a second winding coupled via a center tap,
    a first impedance tuner coupled to the communication circuitry and to the second portion, and
    a second balun, wherein the first balun and the second balun are coupled to the one or more antennas in series.

19. The radio frequency transceiver of claim 18, wherein the first winding comprises a first port and a second port, the first port coupling to the communication circuitry, the second port coupling to a first node via the center tap, and the communication circuitry coupling to the center tap via the first node.

20. The radio frequency transceiver of claim 18, wherein the second winding comprises a first port and a second port, the first port coupling to a first node via the center tap and the second port coupling to the first impedance tuner via a second node.

* * * * *